United States Patent
Chiu et al.

(10) Patent No.: US 9,224,470 B1
(45) Date of Patent: Dec. 29, 2015

(54) MEMORY CIRCUIT AND METHOD OF PROGRAMMING MEMORY CIRCUIT

(71) Applicant: TAIWAN SEMICONDUCTOR MANUFACTURING COMPANY, LTD., Hsinchu (TW)

(72) Inventors: Yi-Chieh Chiu, Taipei (TW); Chih-Yang Chang, Yuanling Township (TW); Tassa Yang, Hsinchu (TW); Wen-Ting Chu, Kaohisung (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/452,177

(22) Filed: Aug. 5, 2014

(51) Int. Cl.
*G11C 13/00* (2006.01)

(52) U.S. Cl.
CPC ........ *G11C 13/0069* (2013.01); *G11C 13/0011* (2013.01)

(58) Field of Classification Search
USPC .................................. 365/148, 158, 185.22
See application file for complete search history.

(56) References Cited

U.S. PATENT DOCUMENTS

| | | |
|---|---|---|
| 6,677,637 B2 | 1/2004 | Bernstein et al. |
| 6,737,728 B1 | 5/2004 | Block et al. |
| 6,781,185 B2 | 8/2004 | Chen et al. |
| 6,803,641 B2 | 10/2004 | Papa Rao et al. |
| 6,849,891 B1 | 2/2005 | Hsu et al. |
| 6,936,881 B2 | 8/2005 | Yeo et al. |
| 6,937,457 B2 | 8/2005 | Shih et al. |
| 6,940,705 B2 | 9/2005 | Yeo et al. |
| 7,195,970 B2 | 3/2007 | Tu et al. |
| 7,407,858 B2 | 8/2008 | Li et al. |
| 7,557,399 B2 | 7/2009 | Tu et al. |
| 8,000,128 B2 | 8/2011 | Li et al. |
| 8,009,454 B2 | 8/2011 | Lee et al. |
| 2010/0202183 A1* | 8/2010 | Kurjanowicz ................ 365/94 |

* cited by examiner

*Primary Examiner* — Vu Le
(74) *Attorney, Agent, or Firm* — Hauptman Ham, LLP

(57) ABSTRACT

A method includes applying a first voltage setting to a first node and a second node of a selected memory cell for a first predetermined period of time in response to a command for programming a first logical state to the selected memory cell. A first stored logical state of the selected memory cell is obtained after the applying the first voltage setting operation. If the first stored logical state differs from the first logical state, a second voltage setting is applied to the first node and the second node of the selected memory cell; and a first retrial is performed. The first retrial includes applying the first voltage setting to the first node and the second node of the selected memory cell for the first predetermined period of time.

20 Claims, 3 Drawing Sheets

| | $V_{WL}$ | | $V_{SL}$ | | $V_{BL}$ | |
|---|---|---|---|---|---|---|
| | SEL | UNSEL | SEL | UNSEL | SEL | UNSEL |
| RESET | $V_H$ | $V_L$ | $V_{P1}$ | | $V_L$ | $V_{P1}$ |
| SET | | | $V_L$ | | $V_{P2}$ | $V_L$ |

US 9,224,470 B1

MEMORY CIRCUIT AND METHOD OF PROGRAMMING MEMORY CIRCUIT

BACKGROUND

In integrated circuit (IC) devices, resistive random access memory (RRAM) is an emerging technology for next generation non-volatile memory devices. RRAM refers to a memory structure including an array of RRAM cells for storing data using resistance, rather than electronic charge. In some applications, an RRAM cell includes a resistance variable layer, which is an insulating material capable of being configured to provide a conductive path through a filament formed after application of a predetermined threshold voltage. Once the filament is formed, the filament is operable to be set (i.e., re-formed, resulting in a lower resistance across the RRAM cell) or reset (i.e., broken, resulting in a high resistance across the RRAM) by appropriately applied voltages. The low and high resistance states thus are utilized to indicate different logical states, such as "1" or "0," of a digital signal, and thereby provide a non-volatile memory cell that can store a bit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
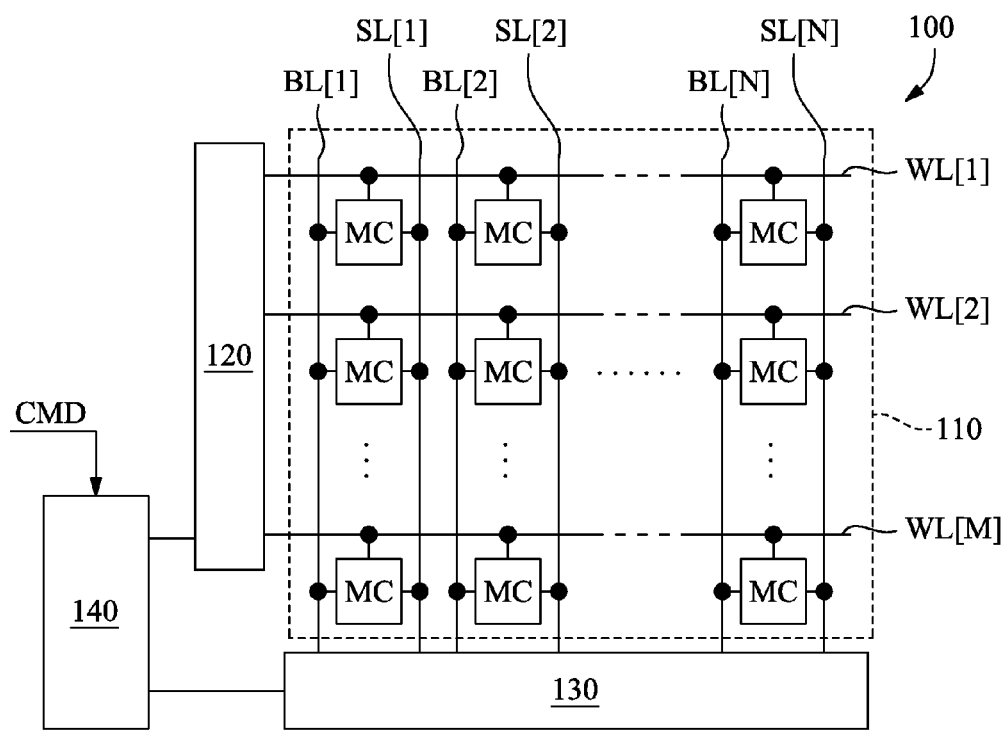
FIG. 1 is a schematic diagram of a memory circuit in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In some embodiments, programming a memory cell, such as an RRAM cell, is performed by applying a first voltage difference across a resistance variable layer of the RRAM cell for a predetermined period of time. In some embodiments, if a first programming attempt fails, a second voltage difference, which has a voltage polarity opposite to the first voltage difference, is applied across the resistance variable layer of the RRAM cell before a second programming attempt is performed. Compared with performing the second programming attempt without applying the second voltage difference, the successful rate of programming the RRAM cell during the second programming attempt is improved.

FIG. 1 is a schematic diagram of a memory circuit 100 in accordance with some embodiments. The memory circuit 100 depicted in FIG. 1 has been simplified in furtherance of the understanding of the present disclosure. In some embodiments, varied or additional electrical components are implemented in conjunction with the memory circuit 100 depicted in FIG. 1.

Memory circuit 100 includes a memory cell array 110, a plurality of word lines WL[1], WL[2], ..., WL[M], a plurality of bit lines BL[1], BL[2], ..., BL[N], a plurality of source lines SL[1], SL[2], ..., SL[N], a word line decoder/driver circuit 120 (also being referred to as the "driver circuit 120"), a bit/source line decoder/amplifier/driver circuit 130 (also being referred to as the "driver circuit 130"), and a controller 140. M and N are positive integers. In some embodiments, memory circuit 100 includes other components not depicted in FIG. 1.

Memory cell array 110 includes a plurality of memory cells MC arranged into rows and columns. In some embodiments, memory cells MC are RRAM cells. The plurality of word lines WL[1] to WL[M] are coupled with corresponding rows of memory cells MC. The plurality of bit lines BL[1] to BL[N] and the plurality of source lines SL[1] to SL[N] are coupled with corresponding columns of memory cells MC. Word line decoder/driver circuit 120 is coupled with the plurality of word lines WL[1] to WL[M]. Bit/source line decoder/amplifier/driver circuit 130 is coupled with the plurality of bit lines BL[1] to BL[N] and the plurality of source lines SL[1] to SL[N]. Controller 140 is coupled with driver circuit 120 and driver circuit 130. In some embodiments, a bit line BL[1], BL[2], or BL[N] is shared by two or more columns of memory cells MC. In some embodiments, a source line SL[1], SL[2], or SL[N] is shared by two or more columns of memory cells MC.

Word line decoder/driver circuit 120 is configured to set voltage levels of word lines WL[1] to WL[M] in order to select one or more rows of memory cells MC in response to address information or an instruction from controller 140. In some embodiments, one of word lines WL[1] to WL[M], such as word line WL[m] where m is a positive integer from 1 to M, is set to have a logical high value while the other word lines are set to have a logical low value in order to select a corresponding row of memory cells MC coupled with word line WL[m].

Bit/source line decoder/amplifier/driver circuit 130 is configured to set voltage levels of bit lines BL[1] to BL[N] and/or source lines SL[1] to SL[N] in order to program or read a corresponding memory cell that is also selected by word line WL[m] in response to address information or an instruction from controller 140. Detail voltage settings of word lines WL[1] to WL[M], bit lines BL[1] to BL[N], and source lines SL[1] to SL[N] are further illustrated in conjunction with FIGS. 2 and 3.

Controller 140 is configured to set circuit 120 and circuit 130 to program or read memory cells MC of memory cell array 110 in response to a command CMD received by controller 140. In some embodiments, controller 140 is configured to control driver circuit 120 and driver circuit 130 according to method 400 depicted in FIG. 4, which will be illustrated below.

Figures 2, 3:
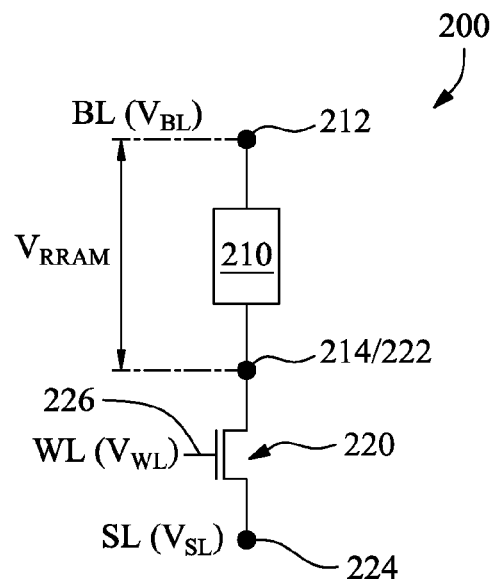
FIG. 2 is circuit diagram of a resistive random access memory (RRAM) cell in accordance with some embodiments.
FIG. 3 is a table of various voltage settings for programming an RRAM cell in accordance with some embodiments.

FIG. 2 is circuit diagram of a resistive random access memory (RRAM) cell 200 in accordance with some embodiments. In some embodiments, RRAM cell 200 is usable as a memory cell in a memory circuit, such as memory cell MC in memory circuit 100 in FIG. 1.

RRAM cell 200 includes an RRAM structure 210 and a pass gate 220. RRAM structure 210 has a first node 212 and a second node 214. Pass gate 220 has a first terminal 222, a second terminal 224, and a control terminal 226. First node 212 is coupled with a corresponding bit line BL of a plurality of bit lines, such as bit lines BL[1] to BL[N] in FIG. 1. Bit line BL has a voltage level $V_{BL}$. Second node 214 is coupled with first terminal 222. Second terminal 224 is coupled with a corresponding source line SL of a plurality of source lines, such as source lines SL[1] to SL[N] in FIG. 1. Source line SL has a voltage level $V_{SL}$. Control terminal 226 is coupled with a corresponding word line WL of the plurality of word lines, such as word lines WL[1] to WL[M] in FIG. 1. Word line WL has a voltage level $V_{WL}$. A voltage difference from node 212 to node 214 is also identified as voltage difference $V_{RRAM}$.

Pass gate 220 is configured to be turned on, i.e., electrically coupling terminal 222 with terminal 224, or to be turned off, i.e., electrically isolating terminal 222 from terminal 224, in response to a voltage level at control terminal 226. In the embodiment depicted in FIG. 2, pass gate 220 is an N-type transistor. In some embodiments, pass gate 220 is a P-type transistor or a transmission gate.

FIG. 3 is a table 300 of various voltage settings for programming an RRAM memory cell, such as RRAM cell 200 in FIG. 2, in accordance with some embodiments. Table 300 provides a non-limiting embodiment of the voltage settings for programming an RRAM memory cell. In some embodiments, RRAM cell 200 is programmed according to voltage settings different from the voltage settings in table 300.

The column "$V_{WL}$" in table 300 lists the voltage settings for word line WL for selecting or unselecting a row of RRAM cells where RRAM cell 200 belongs. If no RRAM cell in the row of RRAM cells is selected for programming (column "UNSEL"), the corresponding word line WL has a voltage level $V_{WL}=V_L$. Voltage level $V_L$ is a voltage level representing logical "0" value. In some embodiments, voltage level $V_L$ is set to be sufficient to turn off pass gate 220 in conjunction with the voltage settings of other nodes/terminals. In some embodiments, voltage level $V_L$ is the same as a reference ground voltage level (i.e., 0 V) of a memory circuit where RRAM cell 200 belongs. If at least one RRAM cell in the row of RRAM cells is selected for programming (column "SEL"), the corresponding word line WL has a voltage level $V_{WL}=V_H$. Voltage level $V_H$ is a voltage level representing logical "1" value. In some embodiments, voltage level $V_H$ is set to be sufficient to turn on pass gate 220 in conjunction with the voltage settings of other nodes/terminals. In some embodiments, voltage level $V_H$ ranges from 1 V to 2 V if voltage level $V_L$ is considered as 0 V.

The column "$V_{SL}$" in table 300 lists the voltage settings for source line SL for biasing a column of RRAM cells where RRAM cell 200 belongs. If one RRAM cell in the column of RRAM cells is selected (column "SEL") to be programmed to have a high resistance state or logical "0" value (row "RESET"), the corresponding source line SL is set to have a voltage level $V_{SL}=V_{P1}$. If one RRAM cell in the column of RRAM cells is selected (column "SEL") to be programmed to have a low resistance state or logical "1" value (row "SET"), the corresponding source line SL is set to have a voltage level $V_{SL}=V_L$. In some embodiments, only one RRAM cell in the column of RRAM cells is selected for programming. In some embodiments, if none of the column of RRAM cells is selected (column "UNSEL") for programming, source line SL is set to have a voltage level the same as that of the bit line BL. In some embodiments, if none of the column of RRAM cells is selected to be programmed, $V_{SL}=V_{BL}=V_{P1}$ or $V_{SL}=V_{BL}=V_L$. In some embodiments, voltage level $V_{P1}$ ranges from 2 V to 3 V if voltage level $V_L$ is considered as 0 V.

The column "$V_{BL}$" in table 300 lists the voltage settings for bit line BL for biasing the column of RRAM cells where RRAM cell 200 belongs. If one RRAM cell in the column of RRAM cells is selected (column "SEL") to be programmed to have a high resistance state (row "RESET"), the corresponding bit line BL is set to have a voltage level $V_{BL}=V_L$. If one RRAM cell in the column of RRAM cells is selected (column "SEL") to be programmed to have a low resistance state (row "SET"), the corresponding bit line BL is set to have a voltage level $V_{BL}=V_{P2}$. In some embodiments, only one RRAM cell in the column of RRAM cells is selected for programming. In some embodiments, if none of the column of RRAM cells is selected (column "UNSEL") for programming, bit line BL is set to have a voltage level the same as that of the source line SL. In some embodiments, if none of the column of RRAM cells is selected to be programmed, $V_{BL}=V_{SL}=V_{P1}$ or $V_{BL}=V_{SL}=V_L$. In some embodiments, voltage level $V_{P2}$ ranges from 2 V to 3 V if voltage level $V_L$ is considered as 0 V. In some embodiments, voltage level $V_{P1}$ equals voltage level $V_{P2}$.

Therefore, if RRAM cell 200 is selected to be programmed to have a high resistance state ("RESET"), the various voltages are set as $V_{WL}=V_H$, $V_{SL}=V_{P1}$, and $V_{BL}=V_L$. Under this scenario, voltage difference $V_{RRAM}$ (FIG. 2) is $-(V_{P1}-V_L)$ for breaking the filament of RRAM structure 210. Also, if RRAM cell 200 is selected to be programmed to have a low resistance state ("SET"), the various voltages are set as $V_{WL}=V_H$, $V_{SL}=V_L$, and $V_{BL}=V_{P2}$. Under this scenario, voltage difference $V_{RRAM}$ is $(V_{P2}-V_L)$ for re-forming the filament of RRAM structure 210.

The logical "1" or "0" or high/low above are introduced for explaining the operation of RRAM cell 200. In some embodiments, the definition or polarities of logical "1" or "0" or high/low are swappable with corresponding modification made to the RRAM cell 200 and/or the memory circuit 100.

Figure 4:
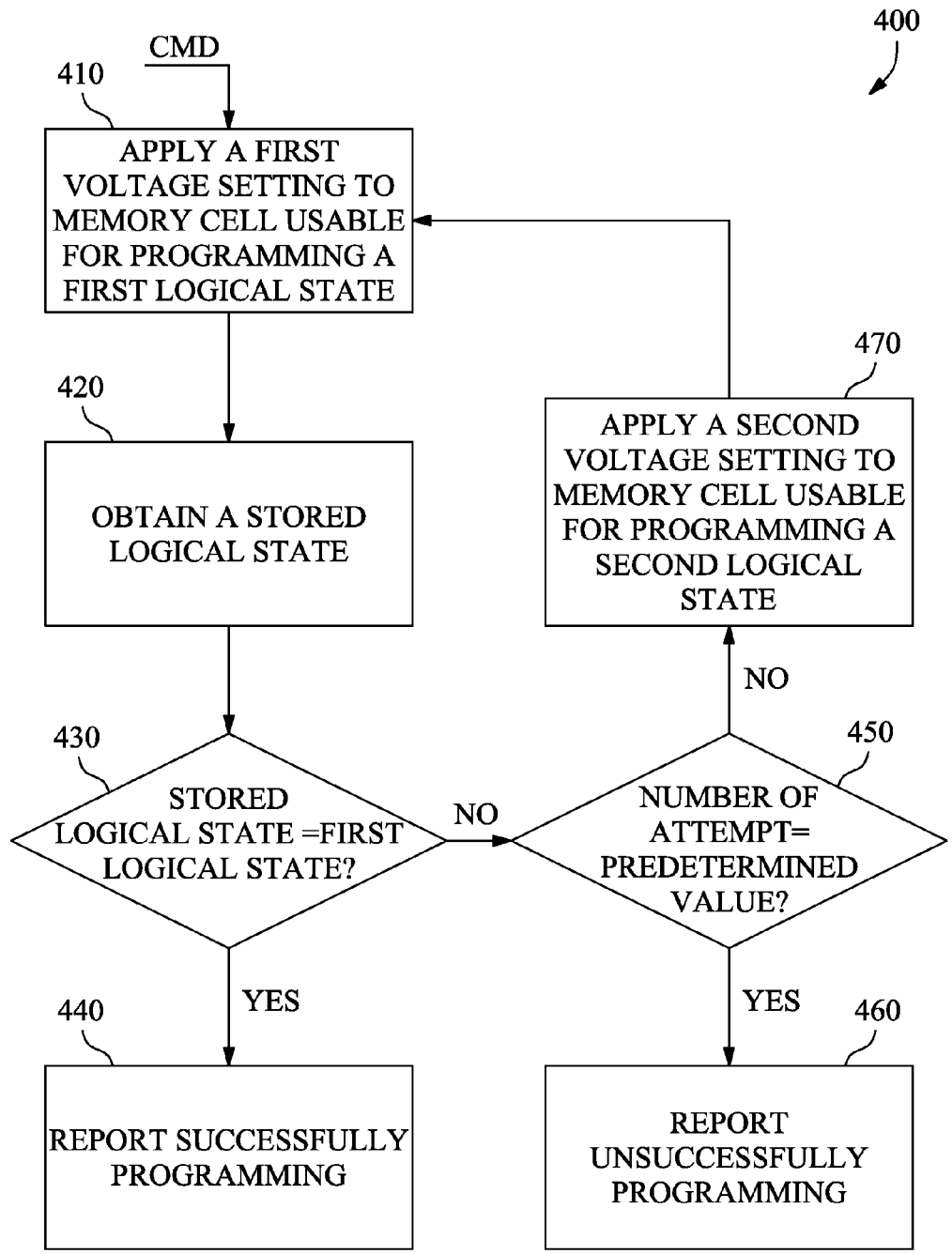
FIG. 4 is a flow chart of a method of programming a selected RRAM cell in accordance with some embodiments.

FIG. 4 is a flow chart of a method 400 of programming a selected RRAM memory cell in accordance with some embodiments. Method 400 is usable to program an RRAM cell, such as RRAM cell 200 in FIG. 2, according to various voltage settings, such as voltage settings in table 300 in FIG. 3. It is understood that additional operations may be performed before, during, and/or after the method 400 depicted in FIG. 4, and that some other processes may only be briefly described herein.

Method 400 starts with operation 410, where a first voltage setting is applied to a first node (such as node 212 in FIG. 2) and a second node (such as node 214) of a selected memory cell (such as RRAM cell 200) for a first predetermined period of time in response to a command CMD for programming a first logical state to the selected memory cell 200.

For example, if the command CMD instructs the controller 140 (FIG. 1) to program a logical value "0" or "1" to RRAM cell 200 (which corresponds one of memory cells MC), controller 140 sets driver circuits 120 and 130 to apply a first voltage setting corresponding to program the to-be-written logical value to node 212 and 214 a predetermined period of time. In some embodiments, the predetermined period of time ranges from 1 µs to 1 ms. In some embodiments, the predetermined period of time for programming logical value "0" and "1" are different.

In some embodiments for programming the logical value "0," the first voltage setting includes setting a voltage level $V_{WL}$ of a corresponding word line WL at voltage level $V_H$;

setting a voltage level $V_{SL}$ of a corresponding source line SL at voltage level $V_{P1}$; and setting a voltage level $V_{BL}$ of a corresponding bit line BL at voltage level $V_L$. In some embodiments, the first voltage setting corresponding to causing node 212 and node 214 to have a voltage difference $V_{RAMM}$ ranging from 2V to 3V.

In some embodiments for programming the logical value "1," the first voltage setting includes setting a voltage level $V_{WL}$ of a corresponding word line WL at voltage level $V_H$; setting a voltage level $V_{SL}$ of a corresponding source line SL at voltage level $V_L$; and setting a voltage level $V_{BL}$ of a corresponding bit line BL at voltage level $V_{P2}$. In some embodiments, the first voltage setting corresponding to causing node 212 and node 214 to have a voltage difference $V_{RAMM}$ ranging from −2V to −3V.

The process proceeds to operation 420, where the controller 140 operates driver circuits 120 and 130 to obtain a stored logical state of the selected RRAM cell 200 after performing operation 410. Then, in operation 430, controller 140 determines if the stored logical state is the same as the to-be-written logical state dictated by the command CMD. If the stored logical state is the same as the to-be-written logical state, the process proceeds to operation 440, where the controller 140 reports in response to the command CMD that the programming instruction has been carried out successfully.

In some embodiments, materials at a junction of a resistance variable layer and an electrode of the RRAM structure 210 of RRAM cell 200 form a parasitic Schottky junction that effectively reduces an absolute value of the voltage difference actually applied to the resistance variable layer of RRAM structure 210. The parasitic Schottky junction is randomly formed and sometimes inhibits RRAM cell 200 from being correctly programmed. Therefore, occasionally the stored logical state is different from the to-be-written logical state.

In operation 430, if it is determined that the stored logical state is different from the to-be-written logical state, the process proceeds to operation 450, where the controller 140 further determines if a number of programming attempts equals a predetermined number. In some embodiments, the predetermined number for allowable programming attempts ranges from 2 to 8. If it is determined that the number of programming attempts has reached the predetermined number, the process proceeds to operation 460, where the controller 140 reports in response to the command CMD that the programming instruction cannot be carried out successfully.

In operation 450, if it is determined that the number of programming attempts is less than the predetermined number, the process proceeds to operation 470. In operation 470, a second voltage setting is applied to first node 212 and second node 214 of RRAM cell 200. The second voltage setting is applied for a predetermined period of time that, in some embodiments, is not the same as the predetermined of time in operation 410. The voltage difference $V_{RAMM}$ caused by the second voltage setting and that caused by the first voltage setting have opposite polarities. The voltage difference $V_{RAMM}$ caused by the second voltage setting and the waveform thereof is sufficient to break the parasitic Schottky junction that interfere with successful performance of operation 410.

In some embodiments, if the first voltage setting corresponds to programming logical value "0" to RRAM cell 210, the second voltage setting corresponds to programming logical value "1" to RRAM cell 210, or vice versa. In some embodiments, the time period for applying the second voltage setting is the same as the predetermined time period in operation 410.

In some embodiments, the second voltage setting is not same as the voltage settings for programming logical value "1" or "0" opposite to the one used in operation 410 for the to-be-written logical value. In one example for programming the logical value "0," the second voltage setting includes setting the voltage level $V_{SL}$ of source line SL at voltage level $V_L$; and setting the voltage level $V_{BL}$ of bit line BL at voltage level $V_{P3}$ different from voltage level $V_{P2}$. In another example for programming the logical value "1," the second voltage setting includes setting the voltage level $V_{SL}$ of source line SL at voltage level $V_{P3}$; and setting the voltage level $V_{BL}$ of bit line BL at voltage level $V_L$. In some embodiments, voltage level $V_{P3}$ also ranges from 2V to 3V.

In yet another example for programming the logical value "0," the second voltage setting includes maintaining one of the voltage level $V_{SL}$ of source line SL and the voltage level $V_{BL}$ of bit line BL, and setting the other one of the voltage level $V_{SL}$ and the voltage level $V_{BL}$ to cause node 212 and node 214 to have a voltage difference $V_{RAMM}$ ranging from −2V to −3V. In yet another example for programming the logical value "1," the second voltage setting includes maintaining one of the voltage level $V_{SL}$ of source line SL and the voltage level $V_{BL}$ of bit line BL, and setting the other one of the voltage level $V_{SL}$ and the voltage level $V_{BL}$ to cause node 212 and node 214 to have a voltage difference $V_{RAMM}$ ranging from 2V to 3V.

The process then proceeds to operation 410 to perform a retrial for programming RRAM cell 210 according to the to-be-written logical value dictated by the command CMD, where the first voltage setting is again applied to node 212 and node 214 for the predetermined period of time. For the second programming attempt, the process proceeds to operation 420 for obtaining the stored logical state and to operation 430 for determining if the stored logical state differs from the to-be-written logical value. If the stored logical state and the to-be-written logical value are different, the process proceeds to operations 450, 470, and back to 410 in a manner similar to performing the first programming attempt. Therefore, operations 410, 420, 430, 450, and 470 are performed in a repetitive manner until a condition for exiting to operation 440 and 460 is met.

In other words, method 400 includes performing an i-th programming attempt including operations 410, 420, and 430. The index i is a positive integer. The first (index i=1) programming attempt is performed in response to a command CMD for programming the first logical state to the selected RRAM cell. If it is determined in operation 430 that the stored logical state differs from the to-be-written logical value dictated by the command CMD and if it is determined in operation 450 that the index i is less than the predetermined number, the process proceeds to operation 470. Afterwards, performing an (i+1)-th programming attempt. In some embodiments, the time period for applying the first voltage setting in operation 410 during the second or subsequent programming attempt differs from one another or the time period used during performing the first programming attempt.

In accordance with one embodiment, a method includes applying a first voltage setting to a first node and a second node of a selected memory cell for a first predetermined period of time in response to a command for programming a first logical state to the selected memory cell. A first stored logical state of the selected memory cell is obtained after the applying the first voltage setting operation. If the first stored logical state differs from the first logical state, a second voltage setting is applied to the first node and the second node of the selected memory cell; and a first retrial is performed. The first retrial includes applying the first voltage setting to the first node and the second node of the selected memory cell for the first predetermined period of time.

In accordance with another embodiment, a method includes performing an i-th programming attempt, which includes applying a first voltage setting to a first node and a second node of the selected memory cell for a first predetermined period of time; obtaining a stored logical state of the selected memory cell after performing the applying the first voltage setting; and, if the stored logical state differs from a first logical state and if an index i is less than a predetermined number, applying a second voltage setting to the first node and the second node of the selected memory cell; and performing an (i+1)-th programming attempt. The index i is a positive integer. The first (index i=1) programming attempt is performed in response to a command for programming the first logical state to the selected memory cell.

In accordance with another embodiment, a circuit includes a plurality of memory cells arranged into rows and columns, a plurality of word lines coupled with corresponding rows of memory cells of the plurality of memory cells, a plurality of bit lines coupled with corresponding columns of memory cells of the plurality of memory cells, a plurality of source lines coupled with corresponding columns of memory cells of the plurality of memory cells, one or more driver circuits coupled with the plurality of word lines, the plurality of bit lines, and plurality of source lines, and a controller coupled with the one or more driver circuits. The controller is configured to: set the one or more driver circuits to apply a first voltage setting to a first node and a second node of a selected memory cell of the plurality of memory cells for a first predetermined period of time in response to a command for programming a first logical state to the selected memory cell; obtain a stored logical state of the selected memory cell after the applying the first voltage setting operation; and, if the stored logical state differs from the first logical state, set the one or more driver circuits to apply a second voltage setting to the first node and the second node of the selected memory cell; and set the one or more driver circuits to apply the first voltage setting to the first node and the second node of the selected memory cell for the first predetermined period of time after the applying the second voltage setting operation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    applying a first voltage setting to a first node and a second node of a selected memory cell for a first predetermined period of time in response to a command for programming a first logical state to the selected memory cell;
    obtaining a first stored logical state of the selected memory cell after the applying the first voltage setting operation; and
    if the first stored logical state differs from the first logical state:
        applying a second voltage setting to the first node and the second node of the selected memory cell; and
        performing a first retrial, comprising applying the first voltage setting to the first node and the second node of the selected memory cell for the first predetermined period of time.

2. The method of claim 1, further comprising:
    obtaining a second stored logical state of the selected memory cell after the performing the first retrial operation;
    if the second stored logical state differs from the first logical state:
        applying the second voltage setting to the first node and the second node of the selected memory cell; and
        performing a second retrial, comprising applying the first voltage setting to the first node and the second node of the selected memory cell for the first predetermined period of time.

3. The method of claim 1, further comprising:
    applying the second voltage setting to the first node and the second node of the selected memory cell for a second predetermined period of time in response to another command for programming a second logical state to the selected memory cell.

4. The method of claim 3, wherein the applying the second voltage setting if the first stored logical state differs from the first logical state is performed for the second predetermined period of time.

5. The method of claim 1, further comprising:
    applying a third voltage setting to the first node and the second node of the selected memory cell for a second predetermined period of time in response to another command for programming a second logical state to the selected memory cell.

6. The method of claim 1, wherein
    the first voltage setting corresponds to causing a first voltage difference between the first node and the second node of the selected memory cell; and
    the second voltage setting corresponds to causing a second voltage difference between the first node and the second node of the selected memory cell, the first voltage difference and the second voltage difference have opposite polarities.

7. The method of claim 6, wherein
    one of the first voltage difference and the second voltage difference ranges from 2 V to 3 V; and
    the other one of the first voltage difference and the second voltage difference ranges from −2 V to −3 V.

8. The method of claim 6, wherein
    the first voltage setting comprises:
        setting the first node at a first predetermined voltage level; and
        setting the second node at a second predetermined voltage level; and
    the second voltage setting comprises performing one of the following operation:
        setting the first node at the first predetermined voltage level; or
        setting the second node at the second predetermined voltage level.

9. The method of claim 1, wherein
    the memory cell is a resistive random-access memory (RRAM) cell;
    the first node is coupled with a bit line;
    the second node is selectively coupled with a source line through a pass gate;
    the pass gate is configured to be turned on or off in response to a voltage level on a word line; and the first voltage setting or the second voltage setting comprises setting the voltage level on the word line to be sufficient to turn on the pass gate.

10. A method, comprising:
performing an i-th programming attempt, comprising:
applying a first voltage setting to a first node and a second node of a selected memory cell for a first predetermined period of time;
obtaining a stored logical state of the selected memory cell after performing the applying the first voltage setting; and
if the stored logical state differs from a first logical state and if an index i is less than a predetermined number:
applying a second voltage setting to the first node and the second node of the selected memory cell; and
performing an (i+1)-th programming attempt,
wherein
the index i is a positive integer; and
a first (index i=1) programming attempt is performed in response to a command for programming the first logical state to the selected memory cell.

11. The method of claim 10, wherein the predetermined number ranges from 2 to 8.

12. The method of claim 10, further comprising:
performing another programming attempt, comprising applying the second voltage setting to the first node and the second node of the selected memory cell for a second predetermined period of time in response to a command for programming a second logical state to the selected memory cell.

13. The method of claim 12, wherein if the stored logical state differs from the first logical state and if the index i is less than the predetermined number, then the applying the second voltage setting is performed for the second predetermined period of time.

14. The method of claim 10, further comprising:
performing another programming attempt, comprising applying a third voltage setting to the first node and the second node of the selected memory cell for a second predetermined period of time in response to a command for programming a second logical state to the selected memory cell.

15. The method of claim 10, wherein
the first voltage setting corresponds to causing a first voltage difference between the first node and the second node of the selected memory cell; and
the second voltage setting corresponds to causing a second voltage difference between the first node and the second node of the selected memory cell, the first voltage difference and the second voltage difference have opposite polarities.

16. The method of claim 15, wherein
one of the first voltage difference and the second voltage difference ranges from 2 V to 3 V; and
the other one of the first voltage difference and the second voltage difference ranges from −2 V to −3 V.

17. The method of claim 16, wherein
the first voltage setting comprises:
setting the first node at a first predetermined voltage level; and
setting the second node at a second predetermined voltage level; and
the second voltage setting comprises performing one of the following operations:
setting the first node at the first predetermined voltage level; or
setting the second node at the second predetermined voltage level.

18. A circuit, comprising:
a plurality of memory cells arranged into rows and columns;
a plurality of word lines coupled with corresponding rows of memory cells of the plurality of memory cells;
a plurality of bit lines coupled with corresponding columns of memory cells of the plurality of memory cells;
a plurality of source lines coupled with corresponding columns of memory cells of the plurality of memory cells;
one or more driver circuits coupled with the plurality of word lines, the plurality of bit lines, and the plurality of source lines; and
a controller coupled with the one or more driver circuits, and configured to:
set the one or more driver circuits to apply a first voltage setting to a first node and a second node of a selected memory cell of the plurality of memory cells for a first predetermined period of time in response to a command for programming a first logical state to the selected memory cell;
obtain a stored logical state of the selected memory cell after the applying the first voltage setting operation; and
if the stored logical state differs from the first logical state:
set the one or more driver circuits to apply a second voltage setting to the first node and the second node of the selected memory cell; and
set the one or more driver circuits to apply the first voltage setting to the first node and the second node of the selected memory cell for the first predetermined period of time after the applying the second voltage setting operation.

19. The circuit of claim 18, wherein the selected memory cell comprises:
a resistive random-access memory (RRAM) structure having the first node and the second node, the first node being coupled with a bit line of the plurality of bit lines;
a pass gate having a first terminal, a second terminal, and a control terminal, the first terminal being coupled with the second node of the RRAM structure, the second terminal being coupled with a source line of the plurality of source lines, and the control terminal being coupled with a word line of the plurality of word lines.

20. The circuit of claim 18, wherein the controller is further configured to:
set the one or more driver circuits to apply the second voltage setting to the first node and the second node of the selected memory cell of the plurality of memory cells for a second predetermined period of time in response to a command for programming a second logical state to the selected memory cell.

* * * * *